United States Patent [19]
Honda

[11] Patent Number: 5,245,510
[45] Date of Patent: Sep. 14, 1993

[54] HYBRID INTEGRATED CIRCUIT DEVICE

[75] Inventor: Ziro Honda, Itami, Japan

[73] Assignee: Mitsubishi Denki Kabushiki Kaisha, Tokyo, Japan

[21] Appl. No.: 958,720

[22] Filed: Oct. 9, 1992

[30] Foreign Application Priority Data

May 22, 1992 [JP] Japan .................. 4-130487

[51] Int. Cl.$^5$ .................. H05K 7/20
[52] U.S. Cl. .................. 361/718; 165/185; 174/16.3; 257/720; 257/470; 257/706; 374/141; 374/145; 361/714
[58] Field of Search .................. 165/80.3, 185; 174/16.3; 257/706, 707, 712, 720, 470; 361/383, 386–389, 400; 374/141, 145

[56] References Cited

U.S. PATENT DOCUMENTS

| | | | |
|---|---|---|---|
| 4,561,010 | 12/1985 | Ogihara et al. | 257/706 |
| 4,811,166 | 3/1989 | Alvarez et al. | 257/720 |
| 5,140,394 | 8/1992 | Cobb, III et al. | 257/470 |

*Primary Examiner*—Gregory D. Thompson
*Attorney, Agent, or Firm*—Leydig, Voit & Mayer

[57] ABSTRACT

A hybrid integrated circuit device has a primary heat sink and a secondary heat sink. A heat-generating semiconductor chip is mounted on the primary heat sink. A thermocouple is embedded in a portion of the primary heat sink immediately below a heat-generating portion of the semiconductor chip. The thermocouple measures the temperature of the heat-generating portion of the semiconductor chip with a high degree of accuracy. Power supplied to the semiconductor chip is controlled in accordance with the measured temperature of the heat-generating portion of the semiconductor chip, thus enabling the semiconductor chip to operate at its full output performance without risk of breakdown due to overheating.

2 Claims, 2 Drawing Sheets

HYBRID INTEGRATED CIRCUIT DEVICE

BACKGROUND OF THE INVENTION

1. Field of the Invention

The present invention relates to a hybrid integrated circuit device and, more particularly, to a hybrid integrated circuit device which is improved to make it possible to fully utilize the output performance of a component of the device.

2. Description of the Related Art

Referring to FIG. 5 which is a sectional side elevational view of a known hybrid integrated circuit device, an aluminum insulating substrate 2 is fixed to the upper side of a secondary heat sink such as an alumina heat sink 1 by soldering as at 3. A primary heat sink such as a copper heat sink 4 and a heat-generating semiconductor chip such as power transistor 5 are mounted successively on the aluminum insulating substrate 2 by soldering as at 3", 3'3. A thick film resistor substrate 7 is fixed to the aluminum heat sink 1 by an adhesive 6 such as a silicone resin type adhesive. Circuit elements such as conductors 8 and resistors 9 are formed on the thick film resistor substrate 7 by, for example, printing, and other circuit elements such as capacitors 10 and a controlling IC are fixed to the upper side of the thick film resistor substrate 7 by soldering as at 12. The power transistor 5 is electrically connected to the thick film resistor substrate 7 through, for example, a wire such as aluminum wire 13.

In the known hybrid integrated circuit having the described construction, the power transistor generates heat at a large rate. In order to prevent breakdown of the hybrid integrated circuit device, therefore, it is necessary to maintain the temperature of the hybrid integrated circuit device during operation at a temperature below the lowest bonding temperature in the device. Hitherto, such temperature control has been achieved by tentatively cutting off the power supply or reducing the level of the power so as to maintain the temperature of the hybrid integrated circuit device within a predetermined range of temperature. More specifically, the known hybrid integrated circuit device has a temperature measuring means (not shown) provided on the aluminum heat sink 1 which serves as the secondary heat sink, and the power applied to the device is controlled in accordance with the temperature measured by the temperature measuring means, to thereby maintain the temperature of the device below the lowest bonding temperature.

In this known hybrid integrated circuit device, however, it is impossible to accurately measure the temperature of the device because the temperature measuring means is provided on the aluminum heat sink 1 which serves as the secondary heat sink. Consequently, it has been impossible to make the full use of the output performance of the hybrid integrated circuit device.

Thus, the thermal design of the hybrid integrated circuit device has to have a large margin, and the power supplied to the device has to be carefully controlled to prevent any portion of the device from being heated to a temperature above the minimum bonding temperature. As a consequence, the potential output performance of the hybrid integrated circuit device could not be fully utilized.

SUMMARY OF THE INVENTION

Accordingly, an object of the present invention is to provide hybrid integrated circuit device which is improved to enable full use of the output performance thereof.

To this end, according to one aspect of the present invention, there is provided a hybrid integrated circuit device, comprising: a secondary heat sink; a primary heat sink mounted on the primary heat sink; a heat-generating semiconductor chip mounted on the primary heat sink; and a thermocouple having sensing tip portion embedded in a portion of the primary heat sink is immediately below the heat-generating portion of the semiconductor chip.

According to a second aspect of the invention, there is provided a hybrid integrated circuit device, comprising: a secondary heat sink; a primary heat sink mounted on the secondary heat sink; a heat-generating semiconductor chip mounted on the primary heat sink; a third heat sink provided on the secondary heat sink adjacent to the primary heat sink; and a temperature measuring diode mounted on the a third heat sink.

The above and other objects, features and advantages of the present invention will become clear from the following description of the preferred embodiments when the same is read in conjunction with the accompanying drawings.

DESCRIPTION OF THE PREFERRED EMBODIMENTS

Figure 1:
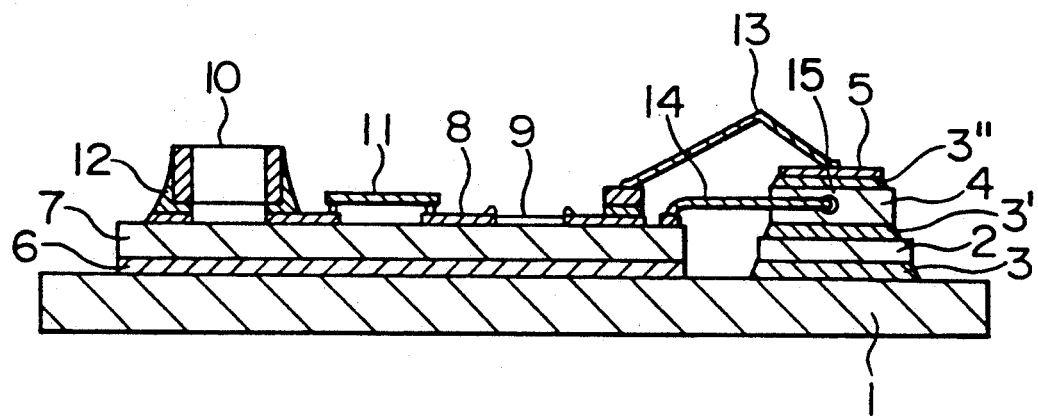
FIG. 1 is a sectional side elevational view of an embodiment of the hybrid integrated circuit device of the present invention.

FIG. 1 is a sectional side elevational view of an embodiment of the hybrid integrated circuit device of the present invention. Throughout the drawings, the same reference numerals denote the same parts or members. Thus, description of parts or members which are the same as those in the known device mentioned before are not described, in order to avoid duplication of the description.

Referring to FIG. 1, a hole 15 is formed in one side of a copper heat sink 4 serving as a primary heat sink. The hole 15 receives a thermocouple 14 for measuring the temperature of a semiconductor chip such as a power transistor 5.

Figure 2:
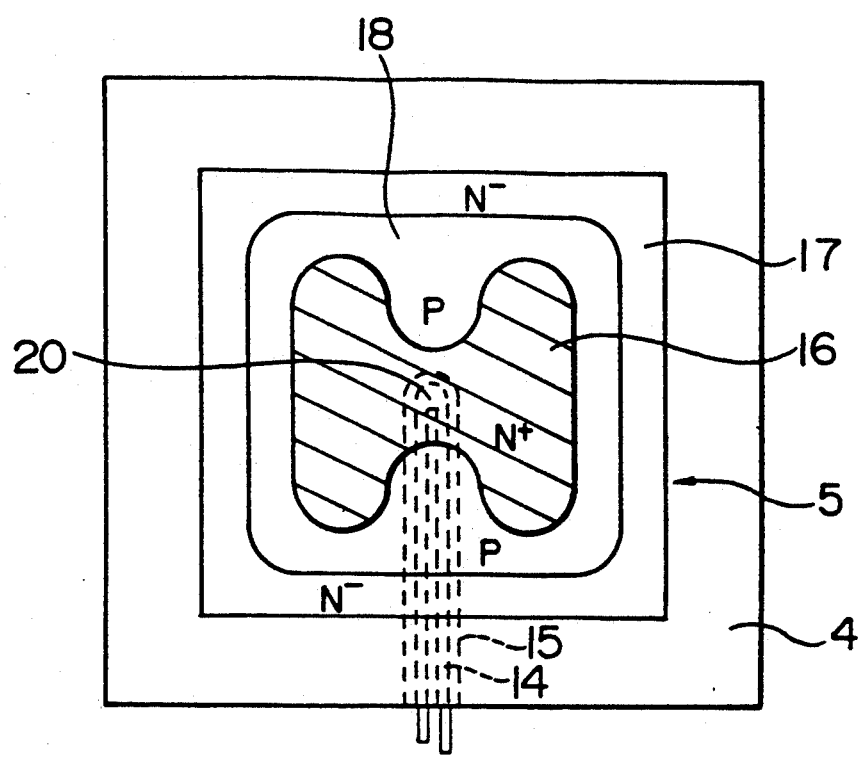
FIG. 2 is an enlarged plan view of a power transistor and a copper heat sink as shown in FIG. 1.
Figure 3:
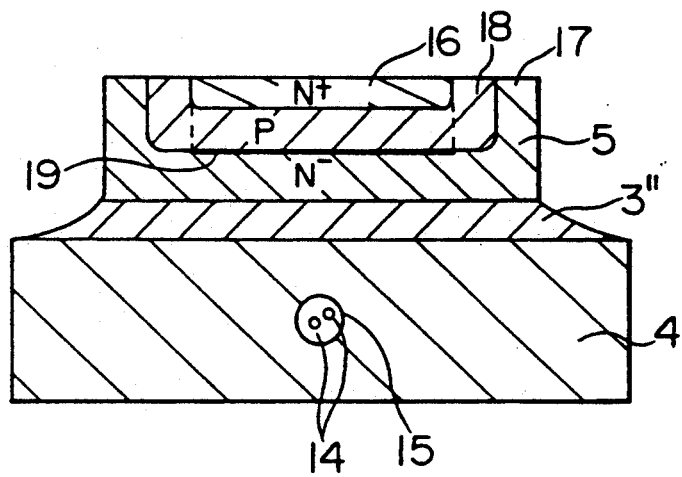
FIG. 3 is an enlarged sectional view of the power transistor and the copper heat sink as shown in FIG. 1.

FIGS. 2 and 3 are an enlarged plan view and an enlarged sectional view of the power transistor 5 and the copper heat sink 4 which are shown in FIG. 1. The power transistor 5 has an emitter region 16, a collector region 17 and a base region 18. Heat is generated in a base-collector junction portion (semiconductor junction portion) 19 which is immediately below the emitter region 16.

The hole 15 is positioned such that the temperature measuring contact 20 on the tip end of the thermocouple 14 is positioned in a portion of the copper heat sink 4 immediately below the base-collector junction portion 19. The signal lines (not shown) of the thermocouple 14 are electrically connected to the thick film resistance substrate 7 on which a control circuit is formed.

In operation of the hybrid integrated circuit device having the described construction, the temperature of the semiconductor junction portion of the power transistor 5 is raised as a result of heat generation. This temperature is monitored by the thermocouple 14 which produces a signal corresponding to the monitored temperature. The signal is delivered through a signal line (not shown) to the control circuit on the thick film resistance substrate 7. The control circuit turns off the power transistor 5 when the measured temperature of the transistor junction of the power transistor 5 exceeds a predetermined limit value, e.g., 150° C. It is thus possible to prevent breakdown of the power transistor 5. In this embodiment, the thermocouple 14 is embedded in a portion of the primary heat sink which is immediately below the base-collector junction 19 of the power transistor 5 where the heat is generated. It is therefore possible to measure the temperature of the base-collector junction 19 with a high degree of accuracy. This enables the power transistor to operate in a region near the maximum allowable limit. It is thus possible to make full use of the output performance of the power transistor 5.

Figure 4:
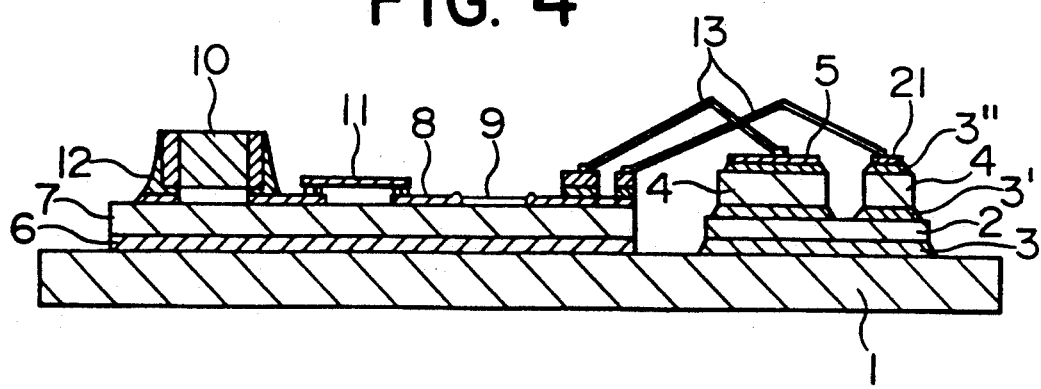
FIG. 4 is a sectional side elevational view of another embodiment of the hybrid integrated circuit device.
Figure 5:
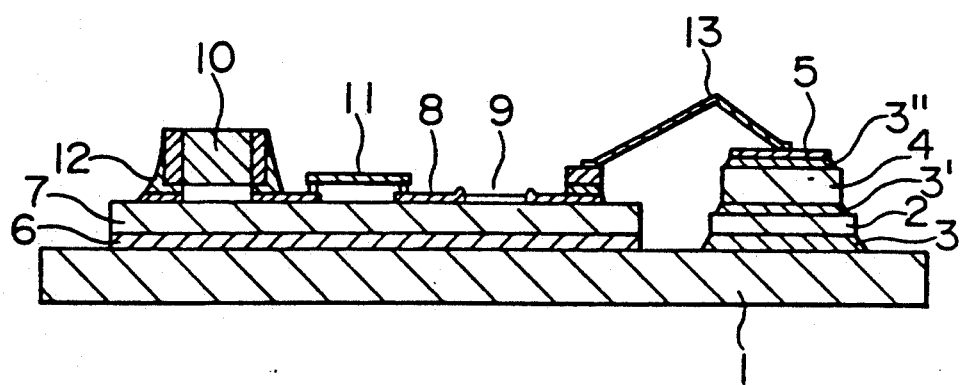
FIG. 5 is a sectional side elevational view of a conventional hybrid integrated circuit device.

FIG. 4 is a sectional side elevational view of another embodiment of the hybrid integrated circuit device of the present invention. Referring to this Figure, a diode 21 is mounted on the copper heat sink 4 by a solder 3″. During the operation of the device, the temperature of the diode 21 is raised by the heat generated by the power transistor 5. The diode 21 is continuously supplied with an electrical current of the forward direction. It will be understood that the level in this forward current decreases linearly in accordance with the rise in the temperature of this diode 21. It is therefore possible to measure the junction temperature of the power transistor 5 by monitoring the level of the forward current in the diode 21. Thus, the hybrid integrated circuit device can be controlled in such a manner that the output performance of the power transistor 5 can be fully utilized, by the operation of the control circuit to which the signal indicative of the junction temperature is fed.

As has been described, according to the present invention, it is possible to measure the temperature in a semiconductor chip with a high degree of accuracy, so that the semiconductor chip can be operated in a region approximating the maximum power condition, through a control of the power in accordance with the measured temperature. In the second embodiment, the junction temperature of a semiconductor chip can be measured by means of a diode and a signal indicative of the junction temperature produced by the diode is fed back to a control circuit which controls the power in such a manner as to enable full use of the output performance of the semiconductor chip without allowing the junction temperature to exceed the maximum allowable temperature.

What is claimed is:

1. A hybrid integrated circuit device comprising:
a secondary heat sink;
a primary heat sink mounted on said secondary heat sink;
a heat-generating semiconductor chip mounted on said primary heat sink, said semiconductor chip having a heat-generating portion; and
a thermocouple having a sensing tip embedded in said primary heat sink directly opposite the heat-generating portion of said semiconductor chip.

2. A hybrid integrated circuit device comprising:
a secondary heat sink;
a primary heat sink mounted on said secondary heat sink;
a heat-generating semiconductor chip mounted on said primary heat sink;
a third heat sink mounted on said secondary heat sink adjacent to said primary heat sink; and
a temperature measuring diode mounted on said third heat sink.

* * * * *